United States Patent
Ono et al.

(10) Patent No.: US 8,124,302 B2
(45) Date of Patent: Feb. 28, 2012

(54) OPTICAL COMPONENT FOR EUVL AND SMOOTHING METHOD THEREOF

(75) Inventors: Motoshi Ono, Chiyoda-ku (JP);
Mitsuru Watanabe, Chiyoda-ku (JP);
Mika Yokoyama, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 226 days.

(21) Appl. No.: 12/582,847

(22) Filed: Oct. 21, 2009

(65) Prior Publication Data

US 2010/0068632 A1    Mar. 18, 2010

Related U.S. Application Data

(63) Continuation of application No. PCT/JP2009/064517, filed on Aug. 19, 2009.

(30) Foreign Application Priority Data

Sep. 12, 2008    (JP) ................. 2008-234906

(51) Int. Cl.
*G03F 1/00*    (2006.01)
*C03C 17/02*    (2006.01)

(52) U.S. Cl. ............... 430/5; 427/140; 427/375
(58) Field of Classification Search ............ 430/5, 30; 427/140, 375
See application file for complete search history.

(56) References Cited

U.S. PATENT DOCUMENTS 5,441,836 A *   8/1995   Balz et al. ............ 430/5
5,742,026 A     4/1998   Dickinson, Jr. et al.

FOREIGN PATENT DOCUMENTS

JP    2008-16823    1/2008

(Continued)

OTHER PUBLICATIONS

"Specification for extreme ultraviolet lithography mask blank", SEMI, P37-1102, 2002, pp. 1-10.

(Continued)

*Primary Examiner* — Stephen Rosasco
(74) *Attorney, Agent, or Firm* — Oblon, Spivak, McClelland, Maier & Neustadt, L.L.P.

(57) ABSTRACT

The present invention provides a method for smoothing an optical surface of an optical component for EUVL. Specifically, the present invention provides a method for smoothing an optical surface of an optical component for EUVL made of a silica glass material containing $TiO_2$ and comprising $SiO_2$ as a main component with a laser having an oscillation wavelength, to which the optical component for EUVL has an absorption coefficient of 0.01 $\mu m^{-1}$ or more, at a fluence of 0.3 to 1.5 $J/cm^2$ in an atmosphere having a water vapor partial pressure of 3.6 mmHg or less.

22 Claims, 1 Drawing Sheet

FOREIGN PATENT DOCUMENTS

| | | |
|---|---|---|
| JP | 2008-27992 | 2/2008 |
| WO | WO 2009/104803 A1 | 8/2009 |

OTHER PUBLICATIONS

"Specification for absorbing film stacks and multilayers on extreme ultraviolet lithography mask blanks", SEMI, P38-1102, 2002, pp. 1-8.

Alan Stivers, et al., "Evaluation of the Capability of a Multibeam Confocal Ins System for Inspection of EUVL Mask Blanks", Proceedings of SPIE, vol. 4889, 2002, pp. 408-417.

Hiroshi Sawada, et al., "Mirror Finishing Using Laser-Induced Periodic Surface Structures", Journal of the Japan Society for Precision Engineering, vol. 73, No. 10, Oct. 5, 2007, pp. 1159-1163 (with partial English translation).

U.S. Appl. No. 12/858,577, filed Aug. 18, 2010, Ono, et al.

Supplementary European Search Report issued Oct. 7, 2011 in EP 09812983.6.

Kiwamu Takehisa, et al.; "EUV Mask Substrate Flatness Improvement by Laser Irradiation"; Proc. of SPIE, Photomask Technology, 2007, vol. 6730, pp. 673051-1-673051-5.

* cited by examiner

[Fig. 1]
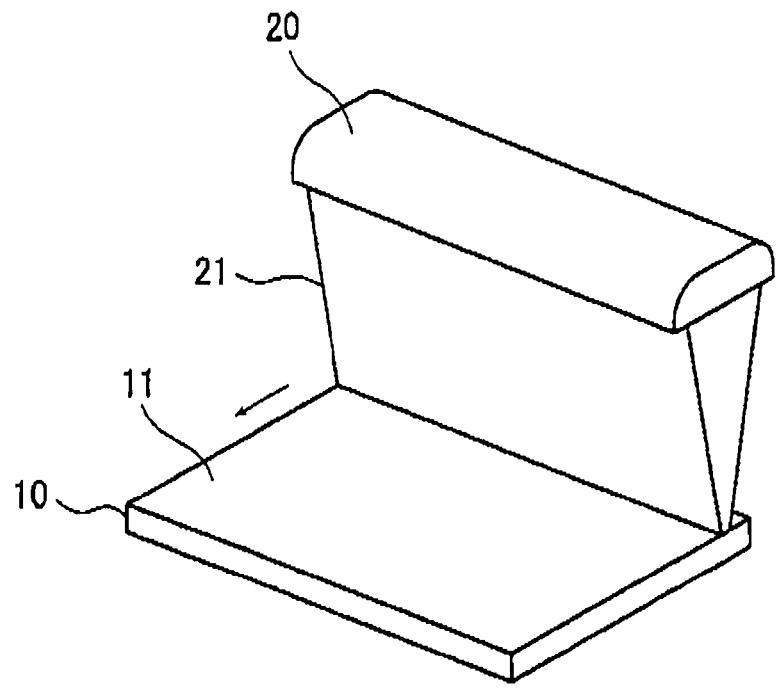
[Fig. 2]
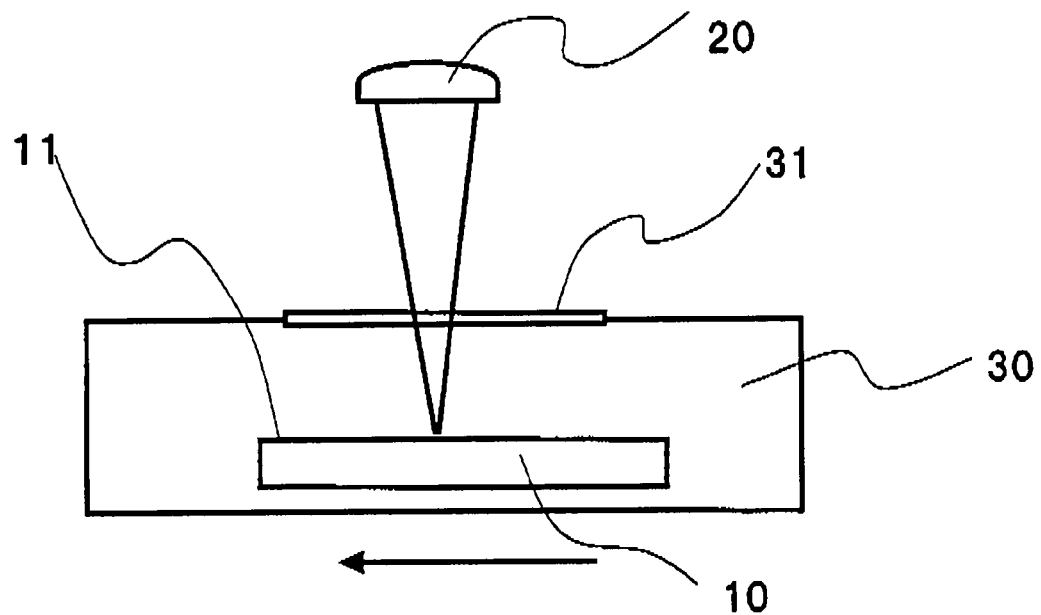

OPTICAL COMPONENT FOR EUVL AND SMOOTHING METHOD THEREOF

TECHNICAL FIELD

The present invention relates to a method for smoothing an optical component for EUV lithography (hereinafter referred to as "EUVL"). More specifically, the present invention relates to a method for smoothing the optical surface having a concave defect such as pit or scratch of an optical component for EUVL (hereinafter referred to as "the smoothing method of the present invention").

Also, the present invention relates to an optical component for EUVL obtained by the smoothing method of the present invention.

BACKGROUND ART

In the lithography technology, an exposure tool for manufacturing an integrated circuit by transferring a minute circuit pattern onto a wafer has hitherto been widely utilized. With the trend toward a higher degree of integration and a higher function of an integrated circuit, the refinement of the integrated circuit is advancing. The exposure tool is hence required to form a circuit pattern image with high resolution on a wafer surface at a long focal depth, and shortening of the wavelength of an exposure light source is being advanced. The exposure light source advances from the conventional g-line (wavelength: 436 nm), i-line (wavelength: 365 nm) or KrF excimer laser (wavelength: 248 nm), and an ArF excimer laser (wavelength: 193 nm) is coming to be employed. Also, in order to cope with a next-generation integrated circuit whose circuit line width will become 70 nm or less, an immersion lithography technique and a double exposure technique, each using an ArF excimer laser, are regarded as being leading. However, it is considered that even these techniques would be able to cover only the generation with a line width of up to 45 nm.

Under such a technical trend, a lithography technique using EUV light as a next-generation exposure light source (EUVL) is considered to be applicable over the 32-nm and subsequent generations and is attracting attention. EUV light indicates light with a wavelength region in a soft X-ray region or a vacuum ultraviolet region, and this is specifically light at a wavelength of approximately from 0.2 to 100 nm. At present, studies are being made on light at 13.5 nm as the lithography light source. The exposure principle of the EUV lithography is the same as the conventional lithography in that a mask pattern is transferred using a projection optical system. However, since there is no material capable of transmitting light therethrough in the EUV light energy region, a refractive optical system cannot be used. Accordingly, the optical systems are all reflecting optical systems.

The reflecting optical system for use in EUVL includes, for example, a reflective type mask (hereinafter, in the context of the present invention, referred to as a "mask for EUVL") and a mirror such as light collection optical system mirror, illumination optical system mirror and projection optical system mirror (hereinafter, in the context of the present invention, referred to as a "mirror for EUVL").

The mask blank for EUVL used in the production of a mask for EUVL is basically composed of (1) an optical component for EUVL (for example, a glass substrate), (2) a reflective multilayer film formed on the optical surface of the optical component for EUVL and (3) an absorber layer formed on the reflective multilayer film. On the other hand, the mirror for EUVL is basically composed of (1) an optical component for EUVL (for example, a glass substrate) and (2) a reflective multilayer film formed on the optical surface of the optical component for EUVL.

As for the optical component for EUVL, a material having a low thermal expansion coefficient not causing a strain even under irradiation of EUV light is required and use of a glass having a low thermal expansion coefficient or a glass-ceramics having a low thermal expansion coefficient is being studied. In the following, in the context of the present invention, the glass having a low thermal expansion coefficient and the glass-ceramics having a low thermal expansion coefficient are collectively referred to as a "low expansion glass" or an "extremely low expansion glass".

As for such a low expansion glass and an extremely low expansion glass, a silica glass having added thereto a dopant for decreasing the thermal expansion coefficient of the glass is being most widely used. In addition, the dopant added for the purpose of decreasing the thermal expansion coefficient of the glass is typically $TiO_2$. Specific examples of the silica glass where $TiO_2$ is added as a dopant include ULE (registered trademark) Code 7972 (manufactured by Corning) and Product No. AZ6025 manufactured by Asahi Glass Co., Ltd.

As for the reflective multilayer film, a film having a structure where a plurality of materials differing in the refractive index in the wavelength region of EUV light as the exposure light are periodically laminated in the nm order is used, and this is most commonly a reflective multilayer film formed by alternately laminating a molybdenum (Mo) layer as a layer having a high refractive index in the wavelength region of EUV light (high refractive index layer) and a silicon (Si) layer as a layer having a low refractive index in the wavelength region of EUV light (low refractive index layer) and thereby enhanced in the light reflectance when irradiating the layer surface with EUV light. For the absorber layer, a material having a high absorption coefficient for EUV light, specifically, a material comprising, for example, Cr or Ta as a main component, is used.

If minute irregularities are present on the optical surface of an optical component for EUVL, this adversely affects the reflective multilayer and absorber layer formed on the optical surface. For example, if minute irregularities are present on the optical surface, the periodic structure of the reflective multilayer film formed on the optical surface is disturbed and when EUVL is performed using a mask or mirror for EUVL produced using the optical component for EUVL, the desired pattern may be partially lost or an extra pattern other than the desired pattern may be formed. The disorder of the periodic structure of the reflective multilayer film, which is ascribable to irregularities present on the optical surface, is a serious problem called a phase defect and irregularities larger than a predetermined size are preferably not present on the optical surface.

Non-Patent Literatures 1 and 2 describe requirements regarding the defects of a mask for EUVL and a mask blank for EUVL, and these requirements regarding the defect are very severe. In Non-Patent Literature 1, it is indicated that the presence of a defect exceeding 50 nm on a substrate causes a disorder in the structure of the reflective multilayer film, giving rise to an unexpected profile of the pattern projected on the resist on an Si wafer, and is not allowed. Also, in Non-Patent Literature 1, it is indicated that for preventing an increase in the line edge roughness of a pattern projected on the resist on an Si wafer, the surface roughness of the substrate must be less than 0.15 nm in terms of RMS (root-mean-square roughness). In Patent Literature 2, it is indicated that on a mask blank coated with a reflective multilayer film, which is used for EUV lithography, the presence of a defect exceeding 25 nm is not allowed.

Also, Non-Patent Literature 3 describes what size of a defect on a substrate is likely to be transferred. Non-Patent Literature 3 indicates that a phase defect may change the line width of the printed image. More specifically, it is taught that a phase defect having a surface bump with a height of 2 nm and FWHM (full width at half maximum) of 60 nm is a size marking the border as to whether the defect is likely to be transferred or not and a phase defect in this size causes an unallowable change of 20% (on a mask, 140 nm) in the line width for a line of 35 nm.

Furthermore, Patent Literature 1 describes a method for repairing the concave-convex portion by collecting laser light in the vicinity of the surface or back surface of the concave-convex portion of a mask substrate for EUVL.

Citation List

Patent Literature

Patent Literature 1: JP-A-2008-027992

Non-Patent Literature

Non-Patent Literature 1: SEMI, p. 37-1102(2002), "Specification for extreme ultraviolet lithography mask blank"

Non-Patent Literature 2: SEMI, p. 38-1102(2002)", Specification for absorbing film stacks and multilayers on extreme ultraviolet lithography mask blanks"

Non-Patent Literature 3: SPIE, Vol. 4889, Alan Stivers, et al., p. 408-417 (2002), "Evaluation of the Capability of a Multibeam Confocal Inspection System for Inspection of EUVL Mask Blanks"

DISCLOSURE OF INVENTION

Technical Problem

Among minute concave-convex portions present on the optical surface, a convex defect such as particle (e.g., foreign substance, fiber) or bump of the substrate itself can be removed by a conventional wet cleaning method using hydrofluoric acid or aqueous ammonia or by brush cleaning, precision polishing or the like.

However, a concave defect such as pit or scratch cannot be removed by such a method. Moreover, if a wet cleaning method using hydrofluoric acid or aqueous ammonia is employed for removing a convex defect, the optical surface needs to be slightly etched so as to remove the convex defect by lift-off and a new concave defect may be produced on the optical surface. Even in the case of employing brush cleaning for removing the convex defect, a new concave defect may be produced on the optical surface.

Also, the method described in Patent Literature 1 has a problem that a minute irregularity defect can be hardly treated because by specifying the concave-convex portion, the position on which laser light is focused must be changed to the vicinity of the substrate surface or the vicinity of the substrate back surface depending on whether the defect is a concave part or a convex part.

Therefore, a method for repairing a surface defect by irradiating the entire substrate surface with a laser beam to heat and melt the surface can be considered. However, in this case, since the condition (process window) capable of repairing the surface defect while satisfying the requirements described in Non-Patent Literatures 1, 2, and 3 is very narrow and the defect repair rate is restricted, there is a need for a method for repairing with a wider process window and a higher repair rate.

To solve the above-mentioned problems, an object of the present invention is to provide a method for smoothing an optical surface of an optical component for EUVL having concave defects such as pits or scratches and with a wider process window.

Solution to Problem

To attain the above-mentioned object, the present inventors found out that it is possible to smooth the optical surface having the concave defects while minimizing the adverse effect such as a decrease in flatness and a deterioration in surface roughness, by irradiating the optical surface with a laser having an oscillation wavelength, to which the optical component for EUVL has an absorption coefficient of 0.01 $\mu m^{-1}$ or more, at a specific fluence in an atmosphere having a water vapor partial pressure of 3.6 mmHg or less.

The present invention is attained based on the above findings from the study by the present inventors; and provides a method for smoothing an optical surface of an optical component for EUVL, comprising irradiating the optical surface having a concave defect of an optical component for EUV lithography (EUVL) made of a silica glass material containing $TiO_2$ and comprising $SiO_2$ as a main component, with a laser having an oscillation wavelength, to which the optical component for EUVL has an absorption of 0.01 $\mu m^{-1}$ or more, at a fluence of 0.3 to 1.5 $J/cm^2$ in an atmosphere having a water vapor partial pressure of 3.6 mmHg or less (the method 1 of the present invention).

In the method 1 of the present invention, it is preferred that the method comprises irradiating an optical surface having a concave defect with a depth of greater than 2 nm of the optical component for EUVL with a laser having an oscillation wavelength, to which the optical component for EUVL has the absorption coefficient of 0.01 $\mu m^{-1}$ or more, at the fluence of 0.3 to 1.5 $J/cm^2$ in the atmosphere having a water vapor partial pressure of 3.6 mmHg or less, and thereby obtaining an optical component free from a concave defect having a depth of greater than 2 nm in the optical surface irradiated with the laser.

In the method 1 of the present invention, it is preferred that the atmosphere having a water vapor partial pressure of 3.6 mmHg or less is a vacuum of $10^{-1}$ Pa or less, a nitrogen gas atmosphere having a purity of 90% or more, or a dry air atmosphere having a water vapor partial pressure of 3.6 mmHg or less.

The present invention further provides a method for smoothing an optical surface of an optical component for EUVL, comprising irradiating an optical surface having a concave defect of an optical component for EUV lithography (EUVL) made of a silica glass material containing $TiO_2$ and comprising $SiO_2$ as a main component, with a laser having an oscillation wavelength, to which the optical component for EUVL has an absorption coefficient of 0.01 $\mu m^{-1}$ or more, at a fluence of 0.3 to 1.5 $J/cm^2$ while spraying a laser irradiating site of the optical surface with a gas having a water vapor partial pressure of 3.6 mmHg or less (the method 2 of the present invention).

In the method 2 of the present invention, it is preferred that the method comprises irradiating an optical surface having a concave defect with a depth of greater than 2 nm of the optical component for EUVL with a laser having an oscillation wavelength, to which the optical component for EUVL has the absorption coefficient of 0.01 $\mu m^{-1}$ or more, at the fluence of 0.3 to 1.5 $J/cm^2$ while spraying the laser irradiating site of the optical surface with a gas having a water vapor partial pressure of 3.6 mmHg or less, and thereby obtaining an optical component free from a concave defect having a depth of greater than 2 nm in the optical surface irradiated with the laser.

In the method 2 of the present invention, it is preferred that the gas having a water vapor partial pressure of 3.6 mmHg or less is a nitrogen gas atmosphere having a purity of 90% or more, or a dry air atmosphere having a water vapor partial pressure of 3.6 mmHg or less.

In the method 1 of the present invention and the method 2 of the present invention (hereinafter referred to as "the smoothing method of the present invention"), it is preferred that the method provides a change in flatness of the optical component between before and after the laser irradiation of 300 nm or less.

In the smoothing method of the present invention, it is preferred that the method provides a surface roughness (RMS) of the optical surface after the laser irradiation of 0.15 nm or less.

In the smoothing method of the present invention, it is preferred that the laser has an excimer laser with a wavelength of 250 nm or less, or a carbon dioxide gas laser.

In the smoothing method of the present invention, it is preferred that the laser has a pulse width of 100 μsec or less.

In the smoothing method of the present invention, it is preferred that the laser irradiation is carried out such that the number of shots at each irradiated site becomes 10 or more.

Here, the number of shots indicates the number of times the laser irradiation is carried out over the same site, and the number of shots when the optical surface is irradiated with the laser as a pulse laser, and the irradiation is carried out by scanningly moving the laser with respect to the optical surface or scanningly moving the optical surface with respect to the laser, is defined by repetition rate of pulse laser×beam width in scanning direction÷scanning speed.

In the smoothing method of the present invention, it is preferred that the laser for the irradiation is in the form of a line beam, and the irradiation is carried out by scanningly moving the line beam with respect to the optical surface or scanningly moving the optical surface with respect to the line beam.

In the smoothing method of the present invention, it is preferable to further comprise irradiating a back surface with respect to the optical surface with a laser having an oscillation wavelength, to which the optical component for EUVL has an absorption coefficient of 0.01 $\mu m^{-1}$ or more, at the fluence of 0.3 to 1.5 $J/cm^2$.

In the smoothing method of the present invention, it is preferred that the laser irradiation of the optical surface is carried out in the state of the optical component being heated at 100 to 1,050° C.

Also, the present invention provides an optical component for EUVL produced by the smoothing method of the present invention comprising irradiating an optical surface, in which a surface layer containing the optical surface has a fictive temperature that is higher, by 30° C. or more, than fictive temperatures of the other sites.

Furthermore, the present invention provides an optical component for EUVL produced by the smoothing method of the present invention comprising irradiating an optical surface and a back surface, in which a surface layer containing the optical surface and a surface layer containing the back surface each has a fictive temperature that is higher, by 30° C. or more, than a fictive temperature of the other inside sites.

In addition, the present invention provides a mask blank for EUVL produced by smoothing an optical surface of an optical component for EUVL using the smoothing method of the present invention and then forming a multi-layered reflecting film and an absorber layer on the optical surface.

In the mask blank of the present invention, it is preferred that the formed layer surface is free from a concave defect having a depth of greater than 2 nm.

In the mask blank of the present invention, it is preferred that the formed surface has a surface roughness (RMS) of 0.15 nm or less.

In the mask blank of the present invention, it is preferred that a flatness after the layer formulation is 300 nm or less.

Furthermore, the present invention provides a mirror for EUVL produced by smoothing an optical surface of an optical component for EUVL using the smoothing method of the present invention and then forming a multi-layered reflecting film on the optical surface.

In the mirror for EUVL of the present invention, it is preferred that the formed film surface is free from a concave defect having a depth of greater than 2 nm.

In the mirror for EUVL of the present invention, it is preferred that the formed film surface has a surface roughness (RMS) of 0.15 nm or less.

In the mirror for EUVL of the present invention, it is preferred that a flatness after the film formation is 300 nm or less.

ADVANTAGEOUS EFFECTS OF INVENTION

According to the smoothing method of the present invention, it is possible to smooth the optical surface having the concave defects while minimizing the decrease in flatness and the deterioration in surface roughness, by irradiating the optical surface of the optical component for EUVL having the concave defects with a laser having an oscillation wavelength, to which the optical component for EUVL has an absorption coefficient of 0.01 $\mu m^{-1}$ or more, at a fluence of 0.3 to 1.5 $J/cm^2$ in an atmosphere having a water vapor partial pressure of 3.6 mmHg or less. It is also possible to expect an improvement in defect repair rate. It is also possible to expect a wider process window.

BRIEF DESCRIPTION OF DRAWINGS

FIG. 1 is a schematic view illustrating a state of irradiating the optical surface of an optical component for EUVL with a laser in the form of a line beam.

FIG. 2 is a schematic view illustrating a state of irradiating the optical surface of an optical component for EUVL with a laser in the form of a line beam in a nitrogen atmosphere.

DESCRIPTION OF EMBODIMENTS

The smoothing method of the present invention is described below.

The present invention relates to a method for smoothing an optical surface of an optical component for EUVL, comprising irradiating the optical surface having a concave defect of an optical component for EUVL with a laser having an oscillation wavelength, to which the optical component for EUVL has an absorption coefficient of 0.01 $\mu m^{-1}$ or more, at a fluence of 0.3 to 1.5 $J/cm^2$ in an atmosphere having a water vapor partial pressure of 3.6 mmHg or less.

The optical component for EUVL, to which the smoothing method of the present invention is applied, is made of a silica glass material comprising $SiO_2$ as a main component, where $TiO_2$ is added as a dopant for decreasing the thermal expansion coefficient.

The $TiO_2$ concentration in the silica glass material is not particularly limited as long as the thermal expansion coefficient of the silica glass material can be made low enough to allow use as an optical component for EUVL, but the concentration is preferably from 3 to 10 mass %. When the $TiO_2$ concentration is in this range, the thermal expansion coefficient of the silica glass material becomes sufficiently low, and the material changes into a low expansion glass having a thermal expansion coefficient at 20° C. of 0±30 ppb/° C., preferably an extremely low expansion glass having a thermal expansion coefficient at 20° C. of 0±10 ppb/° C. The $TiO_2$ concentration is preferably from 5 to 9 mass %, more preferably from 6 to 8 mass %.

In the silica glass material, a dopant other than $TiO_2$ may be added as a dopant for decreasing the thermal expansion coefficient. Examples of such a dopant include $SnO_2$. In the case of adding $SnO_2$ as a dopant, the $SnO_2$ concentration in the silica glass material is not particularly limited as long as the thermal expansion coefficient of the silica glass material can be made low enough to allow use as an optical component for EUVL, but the concentration is preferably from 0.1 to 10 mass %. The $SnO_2$ concentration when adding $SnO_2$ as a dopant is more preferably 0.3 mass % or more, still more preferably 0.5 mass % or more. Also, the $SnO_2$ concentration is more preferably 5 mass % or less, still more preferably 3 mass % or less.

Specific examples of the low expansion glass and extremely low expansion glass, where $TiO_2$ is added as a dopant in a concentration above, include ULE (registered trademark) Code 7972 (manufactured by Corning).

In the optical component for EUVL, its optical surface must have high smoothness and high flatness. Specifically, the optical surface is required to have a smooth surface with the surface roughness in terms of RMS (root-mean-square roughness) being 0.15 nm or less and a flatness of 300 nm or less. Even when these required values are satisfied, a localized concave defect called pit or scratch is sometimes still present on the optical surface.

The optical component for EUVL preferably has excellent resistance to a cleaning solution that is used, for example, in the cleaning after producing a mask blank for EUVL or a mirror for EUVL or in the cleaning of a mask for EUVL after patterning the mask blank for EUVL.

Also, the optical component for EUVL preferably has high rigidity so as to prevent deformation due to film stress of a reflective multilayer film and an absorber layer formed on the optical surface. In particular, the optical component preferably has a high specific rigidity of $3\times10^7$ $m^2/s^2$ or more.

The size, thickness and the like of the optical component for EUVL vary depending on the use but, in the case of use as a mask blank for EUVL, these must be appropriately determined, for example, according to the design values of the mask for EUVL. In this case, specific examples of the optical component include a mask blank having an outside dimension of about 6 inch (152.4 mm) square and a thickness of about 0.25 inch (6.3 mm).

In practicing the smoothing method of the present invention, the optical surface of a previously prepared optical component for EUVL is first polished with a polishing abrasive grain such as cerium oxide, zirconium oxide and colloidal silica, and the optical surface is then cleaned with an acidic solution such as hydrofluoric acid, hydrosilicofluoric acid and sulfuric acid, an alkali solution such as aqueous ammonia, or pure water, and dried. In the case where a particle such as foreign substance or fiber is present on the optical surface or where a convex defect such as pump is present on the optical component itself, it is removed by the above-described procedure.

The smoothing method of the present invention is preferably used for an optical surface from which a convex defect is removed by performing the surface polishing and cleaning according to the procedure above.

In the case where the size of the concave defect present on the optical surface is very small, this does not adversely affect the mask blank for EUVL or minor for EUVL produced using the optical component for EUVL, but when a concave defect larger than a certain size is present on the optical surface, the concave defect sometimes appears on the surface of the reflective multilayer film or absorber layer formed on the optical surface and works out to a defect of the mask blank for EUVL or mirror for EUVL produced using the optical component.

The size of the defect present on the optical surface, which works out to a defect of the mask blank for EUVL or mirror for EUVL, cannot be indiscriminately indicated, because this is affected by the diameter, depth and shape of the concave defect and the usage of the optical component, but in the case of an optical component used for the production of a mask blank for EUVL, if a concave defect with a depth of greater than 2 nm is present on the optical surface, a concave defect sometimes appears on the surface of the reflective multilayer film or absorber layer formed on the optical surface and works out to a defect of the mask blank for EUVL or even if not appear on the surface of the reflective multilayer film or absorber layer, the structure in such a film is disturbed to cause a phase defect in some cases. When the depth becomes 2 nm or less, the defect is not resolved and does not work out to a defect in practice. Therefore, the optical surface is preferably smoothed by using the substrate smoothing method of the present invention.

Accordingly, the smoothing method of the present invention is preferably used for an optical component for EUVL having a concave defect with a depth of greater than 2 nm on the optical surface.

It is presumed that in the smoothing method of the present invention, the irradiation of the optical surface having the concave defect with a laser having an oscillation wavelength, to which the optical component for EUVL has an absorption coefficient of 0.01 $\mu m^{-1}$ or more, at a fluence of 0.3 to 1.5 $J/cm^2$ in the atmosphere having a water vapor partial pressure of 3.6 mmHg or less, allows silica glass around the concave defect heated by the irradiation to reflow and fill the concave defect, thereby smoothing the optical surface.

The reason why the present inventors have presumed in this way includes that the fictive temperature of the surface layer containing the optical surface irradiated with the laser rises and becomes high as compared with the fictive temperature of other sites of the optical component, that is, the inside (in comparison with the surface layer) of the optical component or the back surface side with respect to the optical surface. The depth of the surface layer, where the fictive temperature rises by the irradiation with a laser, varies depending on the heat diffusion distance from the irradiation area and the penetration depth of the laser, but in the case of using an excimer laser at a wavelength of 250 nm or less with a pulse width of 100 nsec or less, the depth is 20 $\mu m$ or less.

In view of reflow of the silica glass around the concave defect, the fictive temperature of the surface layer containing the optical surface irradiated by the laser preferably becomes higher by 30° C. or more, more preferably by 200° C. or more, still more preferably by 400° C. or more, especially preferably by 600° C. or more, than the fictive temperature of the other parts of the optical component, that is, the inside of the optical component or the back surface side with respect to the optical surface.

Also, in view of reflow of the silica glass around the concave defect, the fictive temperature of the surface layer containing the optical surface irradiated by the laser is preferably 1,550° C. or more, more preferably 1,650° C. or more, still more preferably 1,700° C. or more, especially preferably 1,750° C. or more.

The present inventors found out that it is preferable that laser irradiation is carried out in an atmosphere having low moisture since the deterioration in RMS due to laser irradiation is not caused, but the reason for this is not clear.

One example of the technique for effectively reducing the moisture in the atmosphere is shown in FIG. 2. In order to reduce effectively the moisture in the atmosphere, as shown in FIG. 2, it is preferable that an optical component 10 for EUVL is placed in a chamber 30 having a laser irradiating window 31 and the inside of the chamber is made to a dry-air atmosphere, a nitrogen gas atmosphere, or a vacuum state. It is also effective that the dry air or the nitrogen gas is continuously applied to a laser irradiating site with a nozzle during the irradiation without using the chamber. If it is a short time, the emission of the dry air or the nitrogen gas is stopped temporarily.

In the smoothing method of the present invention, the laser irradiation is carried out in an atmosphere having a water vapor partial pressure of 3.6 mmHg or less (relative humidity of 15% or less). Alternatively, the laser irradiation is carried out while spraying the laser irradiating site of the optical surface with a gas having a water vapor partial pressure of 3.6 mmHg or less (relative humidity of 15% or less). The relative humidity in this specification means humidity at 25° C.

The laser irradiation is carried out preferably in the atmosphere having a water vapor partial pressure of 3.6 mmHg or less, more preferably in an atmosphere having a water vapor partial pressure of 1.2 mmHg or less (relative humidity of 5% or less), and particularly preferably in an atmosphere having a water vapor partial pressure of 0.3 mmHg or less (relative humidity of 1% or less).

For example, the atmosphere having a water vapor partial pressure of 3.6 mmHg or less is preferably a vacuum state of $10^{-1}$ Pa or less and more preferably a vacuum state of $10^{-2}$ Pa or less. For example, the atmosphere having a water vapor partial pressure of 3.6 mmHg or less is preferably a nitrogen gas atmosphere having a purity of 90% or more, more preferably a nitrogen gas atmosphere having a purity of 95% or more, and particularly preferably a nitrogen gas atmosphere having a purity of 99% or more. For example, the atmosphere having a water vapor partial pressure of 3.6 mmHg or less is preferably a dry air atmosphere having a water vapor partial pressure of 3.6 mmHg or less, more preferably a dry air atmosphere having a water vapor partial pressure of 1.2 mmHg or less, and particularly preferably a dry air atmosphere having a water vapor partial pressure of 0.3 mmHg or less.

The gas applied to the laser irradiating site is preferably a gas having a water vapor partial pressure of 3.6 mmHg or less (relative humidity of 15% or less), more preferably a gas having a water vapor partial pressure of 1.2 mmHg or less (relative humidity of 5% or less), and particularly preferably a gas having a water vapor partial pressure of 0.3 mmHg or less (relative humidity of 1% or less).

For example, the gas having a water vapor partial pressure of 3.6 mmHg or less is preferably a nitrogen gas having a purity of 90% or more, more preferably a nitrogen gas having a purity of 95% or more, and particularly preferably a nitrogen gas having a purity of 99% or more. For example, the gas having a water vapor partial pressure of 3.6 mmHg or less is preferably a dry atmosphere having a water vapor partial pressure of 3.6 mmHg or less, more preferably a dry air atmosphere having a water vapor partial pressure of 1.2 mmHg or less, and particularly preferably a dry air atmosphere having a water vapor partial pressure of 0.3 mmHg or less.

In the smoothing method of the present invention, it is particularly preferable that the laser irradiation is carried out in the nitrogen gas atmosphere having a purity of 99% or more, or the laser irradiation is carried out while spraying with the nitrogen gas having a purity of 99% or more.

In the smoothing method of the present invention, since the optical surface is irradiated with the laser, the surface roughness of the optical surface may be deteriorated depending on the irradiation condition in some cases. However, in the smoothing method of the present invention, since the laser irradiation is carried out in the atmosphere having a water vapor partial pressure of 3.6 mmHg or less, the surface roughness of the optical surface is less deteriorated than that in the conventional art, thereby widening the process window.

It is preferable that a nozzle is used to spray the laser irradiating site with a gas. It is also preferable that a large opening is disposed above the laser irradiating site and a gas is supplied around the laser irradiating site by allowing the gas to flow down (forming a descending flow) therefrom.

In the smoothing method of the present invention, a laser in the oscillation wavelength giving an absorption coefficient of 0.01 µm$^{-1}$ or more for a material used in the optical component for EUVL needs to be used. An excimer laser at a wavelength of 250 nm or less, such as KrF excimer laser (wavelength: 248 nm), ArF excimer laser (wavelength: 193 nm) and F$_2$ excimer laser (wavelength: 157 nm), exhibits a high absorption coefficient of 0.01 µm$^{-1}$ or more for a silica glass material where TiO$_2$ is added as a dopant (from 3 to 10 wt %) and moreover is a high-intensity laser, this laser is suitable as a laser for use in the smoothing method of the present invention. Furthermore, the excimer laser at a wavelength of 250 nm or less is a pulse laser usually having a pulse width of 100 nsec or less and this is advantageous in that the heat diffusion distance at the irradiation site is short. Therefore, since only the surface layer containing the optical surface is heated but the inside of the optical component is not heated, worsening of flatness or deformation of the substrate due to stress or a problem such as birefringence is scarcely incurred.

In the present invention, the laser is irradiated at a fluence of 0.3 to 1.5 J/cm$^2$. If the fluence of the laser is less than 0.3 J/cm$^2$, the surface layer containing the optical surface is not sufficiently heated and the glass around the concave defect is not reflowed, failing in smoothing the optical surface, whereas if the fluence of the laser exceeds 1.5 J/cm$^2$, this causes a problem such as serious deterioration in terms of surface roughness of the optical surface or unacceptable worsening of flatness of the optical component. Also, the fluence of the laser is more preferably from 0.7 to 1.5 J/cm$^2$ because of the following reasons.

By irradiating the optical surface having a concave defect with a laser at a fluence of 0.7 to 1.5 J/cm$^2$, the concave defect depth repair rate for the optical surface, defined by the following formula, becomes preferably 20% or more, more preferably 40% or more:

Concave defect depth repair rate (%)=((depth of concave defect ($PV$ value) before laser irradiation)−(depth of concave defect ($PV$ value) after laser irradiation))/(depth of concave defect ($PV$ value) before laser irradiation)×100.    [Mathematical Formula 1]

In the smoothing method of the present invention, the preferred range of the fluence of the laser by which the optical surface is irradiated varies depending on the wavelength region of the laser used, but in the case of a KrF excimer laser (wavelength: 248 nm), the fluence is preferably from 0.7 to 1.5 J/cm$^2$, more preferably from 0.8 to 1.3 J/cm$^2$, still more preferably from 0.9 to 1.2 J/cm$^2$.

In the case of an ArF excimer laser (wavelength: 193 mm), the fluence is preferably from 0.5 to 1.1 J/cm$^2$, more preferably from 0.6 to 1.0 J/cm$^2$, still more preferably from 0.7 to 0.9 J/cm$^2$.

In the case of an F$_2$ excimer laser (wavelength: 157 nm), the fluence is preferably from 0.3 to 1.5 J/cm$^2$, more preferably from 0.4 to 1.5 J/cm$^2$, still more preferably from 0.5 to 1.5 J/cm$^2$.

As for the laser by which the optical surface is irradiated, a laser having a short pulse width is preferably used, because the heat diffusion distance at the irradiation area becomes short. In this respect, a laser having a pulse width of 100 μsec or less is preferred, a laser having a pulse width of 10 μsec or less is more preferred, a laser having a pulse width of 1 μsec or less is still more preferred, and a laser having a pulse width of 100 nsec or less is especially preferred.

In the smoothing method of the present invention, even when the irradiation with the laser is carried out such that the number of shots at each irradiation area becomes 1, the optical surface can be smoothed. However, for enhancing the effect of reflowing the silica glass around the concave defect and thereby smoothing the optical surface, the laser irradiation is preferably carried out such that the number of shots at each irradiation area becomes 10 or more. The number of shots is more preferably 50 or more, still more preferably 100 or more. However, it must be noted that when the number of shots at each irradiation area is increased, a longer time is required for the irradiation of the laser on the optical surface. Although depending on the pulse width of the laser, the number of shots at each irradiation area is preferably 1,000 or less, more preferably 500 or less, still more preferably 300 or less. The number of shots at each irradiation area can be adjusted by the repetition rate of the laser and the moving rate of the laser relative to the optical surface or the scanning speed of the optical surface relative to the laser.

Smoothing of the optical surface by the laser irradiation can also be achieved by irradiating with the laser, out of the optical surface, only the area where a concave defect is present. However, it takes so much time and is not practical to specify the position of a concave defect present on the optical surface and irradiate the area where the concave defect is present with the laser. Regarding this points, it is not particularly practical, given that a plurality of concave defects are usually present on the optical surface and since different devices are usually used for specifying the position of a concave defect and irradiating with a laser, displacement may occur when irradiating the specified concave defect with the laser.

On the other hand, when the laser irradiation is carried out over the entire optical surface, the position of a concave defect present on the optical surface need not be specified and even when a plurality of concave defects are present on the optical surface, the optical surface can be smoothed by one operation, so that smoothing of the optical surface can be performed in a short time.

Furthermore, in the case where a very small-size concave defect which cannot be detected because of its size being less than the detection limit of a defect inspection machine is present, this may cause a trouble in the production of a mask blank for EUVL, but by irradiating the entire optical surface with the laser, a concave defect in a small size undetectable by the inspection of the optical surface can also be eliminated.

In the smoothing method of the present invention, it is preferable that the laser irradiation is carried out over the entire optical surface. In the smoothing method of the present invention, the laser irradiation is carried out using a laser having an oscillation wavelength, to which the optical component for EUVL has an absorption coefficient of 0.01 μm$^{-1}$ or more at a fluence of 0.3 to 1.5 J/cm$^2$ in the atmosphere having a water vapor partial pressure of 3.6 mmHg or less. Accordingly, even when the entire optical surface is irradiated with the laser, the problem such as a remarkable deterioration in surface roughness of the optical surface or the impermissible decrease in flatness of the optical surface does not occur.

It must be noted that even when a concave defect is present on the optical surface of an optical component for EUVL, the defect sometimes becomes no problem in use. For example, in the case of an optical component used as a mask blank for EUVL, even on the optical surface, when the concave defect is present in a portion other than the portion working out to an exposure region for patterning in the mask blank for EUVL, this does not become a problem in use. For example, the outer edge part or the like of the optical surface comes under the portion.

Also, even on the optical surface of an optical component for EUVL, when the concave defect is present in a portion that is gripped by a clamp or the like when fixing the optical component to a film-forming apparatus or an exposure apparatus, this does not become a problem in use.

Even on the optical surface of an optical component for EUVL, the irradiation with the laser need not be carried out with respect to a site where the presence of a concave defect does not become a problem in use of the optical component.

However, the ratio of such a site occupying in the optical surface is very small and considering the advantage when irradiating the entire optical surface with the laser, the laser irradiation is preferably carried out with respect to at least on 88% or more (area ratio), more preferably 92% or more (area ratio), still more preferably 95% or more (area ratio), of the optical surface.

As described above, in the smoothing method of the present invention, the irradiation with the laser is preferably carried out over the entire optical surface, but it is practically impossible to irradiate the entire optical surface of an optical component for EUVL with the laser with the above-described fluence by one irradiation. This is apparent also from the fact that the outer dimension of the mask blank for EUVL is about 6 inch (152.4 mm) square. Accordingly, for irradiating the entire optical surface of an optical component for EUVL with the laser, the laser beam needs to be moved relative to the optical surface or the optical surface needs to be moved relative to the laser beam.

The method for moving the optical surface relative to the laser beam or moving the optical surface relative to the laser light is not particularly limited, but it is preferred to, as illustrated in FIG. 1, scan the optical surface 11 of an optical component 10 for EUVL with the laser as a line beam 21 either by moving the line beam 21 relative to the optical surface 11 of the optical component 10 for EUVL or moving the line beam 21 relative to the optical surface 11, because uniform irradiation of the entire optical surface 11 with the laser is facilitated and the irradiation with the laser can be carried out over the entire optical surface 11 in a short time. Moving the optical surface 11 relative to the line beam 21 need not involve driving of an optical system and is more preferred.

In FIG. 1, a line beam 21 having the same length as the long side of the optical surface 11 of the optical component 10 for EUVL is moved in the longitudinal direction in the figure. This is preferred because the irradiation of the entire optical surface 11 of the optical component 10 for EUVL with the laser is carried out by moving the line beam 21 once in the longitudinal direction in the figure. However, the present invention is not limited thereto, and a line beam in a length shorter than the long side of the optical surface 11 may be used. In this case, the optical surface 11 of the optical component 10 for EUVL is divided into a plurality of regions according to the length of the line beam, and the line beam is moved for each region. In addition, here, the laser irradiation is carried out doubly in the boundary portion between adjacent regions, but the effect on the optical surface by the overlapped irradiation of the laser is minor and there arises no problem in particular. Rather, the problem is that the time required for irradiation of the entire optical surface is increased by doubly irradiating with the laser, but when the width of the portion doubly irradiated is limited to about 3 mm, no problem arises in particular. The same applies to the case of moving the optical surface 11 relative to the line beam 21.

In FIG. 1, as for the optical system for irradiation as the line beam 21, a cylindrical lens 20 is used. However, the optical system to be used is not limited thereto as long as it can be used as the line beam 21 and, for example, a diffractive optical element (DOE) may be used.

In the smoothing method of the present invention, the laser irradiation may be carried out with respect to the optical surface in the state of the optical component for EUVL being heated. As described above, in the smoothing method of the present invention, it is considered that the glass around a concave defect is heated by the laser irradiation and reflowed to fill the concave defect and the optical surface is thereby smoothed. In the case where the laser irradiation is carried out with respect to the optical surface in the state of the optical component being heated, the fluence of the laser necessary for reflowing the glass around a concave part is expected to be reduced.

In the case of irradiating the optical surface with the laser in the state of the optical component for EUVL being heated, the fluence of the laser necessary for reflowing the silica glass around the concave defect is reduced and this is expected to make minimal the deterioration in terms of surface roughness of the optical surface or the worsening of flatness of the optical component or furthermore prevent the deterioration in terms of surface roughness of the optical surface or the worsening of flatness of the optical component.

In the case where for the purpose of obtaining the effect above, the laser irradiation is carried out with respect to the optical surface in the state of the optical component for EUVL being heated, the optical component is preferably heated at 100° C. or more, more preferably at 300° C. or more, still more preferably at 500° C. or more. However, if the heating temperature of the optical component is excessively high, there arises a problem such as deformation of or effect of stress on the substrate or increase in the processing time due to cooling. Therefore, the heating temperature is preferably 1,050° C. or less, more preferably 900° C. or less, still more preferably 800° C. or less.

As described above, in the smoothing method of the present invention, minor worsening of flatness may be caused in the optical component by the irradiation of a laser on the optical surface. In the case of an optical component for EUVL, the acceptable range for the flatness is very narrow and therefore, worsening of flatness produced in the optical component is preferably reduced as much as possible.

The worsening of flatness produced in the optical component can be reduced as much as possible by adjusting the irradiation conditions with the laser, but given that the cause of generating worsening of flatness is irradiation with a high-energy laser on the optical surface, when the laser irradiation is carried out on the back surface with respect to the optical surface (hereinafter referred to as "the back surface") after irradiating the optical surface with the laser and the flatness is thereby worsened toward the direction opposite from the worsening direction of the flatness generated when the optical surface is irradiated by the laser, worsening of flatness of the optical component at the end of the smoothing method of the present invention can be reduced or furthermore, worsening of flatness of the optical component can be eliminated.

In addition, as described above, in the smoothing method of the present invention, the laser irradiation is preferably carried out over the entire optical surface and therefore, in the case of irradiating the back surface with the laser, the laser irradiation is preferably carried out over the entire back surface. However, as for the site of the optical surface, which is not irradiated by the laser, because of the reasons above, the back surface thereof also need not to be irradiated by the laser.

Furthermore, in the case where the extent of worsening of flatness generated at the irradiation of the optical surface with the laser can be predicted, the back surface may be previously irradiated by the laser to worsen the flatness toward the direction from the worsening direction of the flatness, which is expected to occur when irradiating the optical surface with the laser. By such a treatment as well, worsening of flatness of the optical component can be reduced or furthermore, worsening of flatness of the optical component can be eliminated.

In the case where the back surface is irradiated by the laser for the purpose of reducing or eliminating worsening of flatness of the optical component, the irradiation conditions are preferably on the same level as those for the optical surface. In terms of the fluence in the laser, the fluence $F_1$ in the laser irradiation of the optical surface and the fluence $F_2$ in the laser irradiation of the back surface preferably satisfy $0.5 \leq F_1/F_2 \leq 1.5$, more preferably satisfy $0.9 \leq F_1/F_2 \leq 1.1$. It is preferred that $F_1$ and $F_2$ are substantially the same.

In the case of irradiating the back surface with the laser, the fictive temperature of the surface layer containing the back surface irradiated by the laser also rises. The depth of the surface layer, where the fictive temperature rises, and to what extent the fictive temperature rises are the same as those descried above for the laser irradiation on the optical surface. Accordingly, when the back surface is also irradiated by the laser, the fictive temperature of the optical component after the laser irradiation becomes high in the surface layer containing the optical surface and the surface layer containing the back surface, as compared with the inside of the optical component.

As described above, in the smoothing method of the present invention, it is possible to smooth the optical surface having concave defects by irradiating an optical surface with a laser having an oscillation wavelength, to which the optical component for EUVL has an absorption coefficient of 0.01 $\mu m^{-1}$ or more, at a fluence of 0.3 to 1.5 J/cm$^2$ in the atmosphere having a water vapor partial pressure of 3.6 mmHg or less. Specifically, it is preferable that concave defects having a depth of greater than 2 nm do not exist in the optical surface having been subjected to the laser irradiation, it is more preferable that concave defects having a depth of 1.5 nm or more do not exist, and it is still more preferable that concave defects having a depth of 1.0 nm or more do not exist.

As described above, in the case of an optical component for use in the production of a mask blank for EUVL, when a concave defect with a depth of greater than 2 nm is present on the optical surface, the concave defect sometimes appears on the surface of the reflective multilayer film or absorber layer formed on the optical surface and works out to a defect of the mask blank for EUVL or even if the concave defect does not appear on the surface of the reflective multilayer film or absorber layer, the structure in such a film is disturbed to cause a phase defect in some cases.

According to the smoothing method of the present invention, the optical surface of an optical component for EUVL becomes an optical surface excellent in the smoothness without allowing the presence of a concave defect giving rise to a problem in the production of a mask blank for EUVL or a mirror for EUVL.

According to the smoothing method of the present invention, the optical surface of an optical component for EUVL becomes an optical surface excellent in the smoothness without causing significant deterioration of the flatness which gives rise to a problem in the production of a mask blank for EUVL or a mirror for EUVL. Specifically, the change in flatness of the optical component after the laser irradiation is preferably 300 nm or less, more preferably 150 nm or less, still more preferably 50 nm or less.

According to the smoothing method of the present invention, the optical surface can be smoothed by irradiating the optical surface with a laser without causing deterioration of the surface roughness on the optical surface, which gives rise to a problem in the production of a mask blank for EUVL or a mirror for EUVL. Specifically, the surface roughness (RMS) on the optical surface after the laser irradiation is preferably 0.15 nm or less, more preferably 0.12 nm or less, still more preferably 0.1 nm or less.

When the surface roughness (RMS) on the optical surface is 0.15 nm or less, the optical surface is sufficiently smooth and therefore, there is no possibility of causing disturbance in the reflective multilayer film formed on the optical surface. Disturbance caused in the reflective multilayer film may become a defect of the produced mask blank for EUVL or mirror for EUVL. Also, in the mask for EUVL produced using the mask blank for EUVL, the edge roughness of the pattern is small, and a pattern with good dimensional accuracy is obtained. If the surface roughness on the optical surface is large, the surface roughness of the reflective multilayer film formed on the optical surface and in turn, the surface roughness of the absorber layer formed on the reflective multilayer film become large. As a result, the pattern formed in the absorber layer comes to have a large edge roughness and the dimensional accuracy of the pattern becomes bad.

In the optical component with the optical surface being smoothed by the smoothing method of the present invention, as described above, the fictive temperature of the surface layer containing the optical surface irradiated by the laser rises and becomes high as compared with the fictive temperature of other sites of the optical component, that is, the inside of the optical component or the back surface side with respect to the optical surface. On the other hand, when the back surface is also irradiated by the laser, the fictive temperature is high in the surface layer containing the optical surface and also in the surface layer containing the back surface, as compared with the inside of the optical component.

The elevation in the fictive temperature of the surface layer is expected to bring an effect of enhancing the mechanical strength of the surface layer, such as Young's modulus, fracture toughness value and fatigue characteristic.

In the smoothing method of the present invention, the irradiation with a laser having a wavelength of 250 nm or less is carried out at a fluence of 0.3 to 1.5 J/cm$^2$ and therefore, a color center that is a local structural defect is formed in the surface layer containing the optical surface and the surface layer containing the back surface (when the back surface is also irradiated by the laser).

In the optical component for EUVL of the present invention, a reflective multilayer film or an absorber layer is formed on the optical surface when producing a mask blank for EUVL or a mirror for EUVL and therefore, even when a color center is formed on the optical surface, this does not cause a problem in particular. Also, even when a color center is formed on the back surface, a problem is not caused at all in the use as a mask blank for EUVL or a mirror for EUVL.

EXAMPLE

The present invention is described further in more detail based on examples, but the present invention is not limited to these examples. In addition, Examples 9 to 13 are examples and Examples 1 to 8 are reference examples.

Irradiation Example I

The entire surface of a substrate obtained by cutting a silica glass substrate containing $TiO_2$ as a dopant (having a $TiO_2$ concentration of 7.0 mass %) (Product No. AZ6025 manufactured by Aschi Glass Company, Ltd. of 150 mm square) into a size of 5 cm square was irradiated with a KrF excimer laser (LPX305 manufactured by Coherent Ltd. having a pulse width of 25 ns) while changing an irradiation fluence and the number of shots. At this time, the atmosphere around the substrate is an air with the relative humidity of 60% (water vapor partial pressure of 14.3 mmHg) at a room temperature of 25° C. The KrF excimer laser applied to the substrate surface was in the form of a line beam (25 mm×0.55 mm) using a cylindrical lens as an irradiation optical system and the entire substrate surface was irradiated with the KrF excimer laser by scanningly moving the substrate surface with respect to the line beam.

The number of shots means the number of times of irradiating the same site on the substrate surface with the laser and is indicated by 50×0.55 mm/scanning speed (mm/s) when the repetition rate of the laser is 50 Hz. The surface roughness (RMS value) of the substrate surface having been subjected to the laser irradiation was measured using an atomic force microscope (AFM). The measurement results are shown in Example 2, Example 3, Example 7, and Example 8 of Table 1.

TABLE 1

|  | Atmosphere | Fluence (J/cm$^2$) | Number of Shots | Concave Defect Depth Before Irradiation/ After Irradiation | Repair Rate (%) | RMS of Before Irradiation (nm) | RMS of After Irradiation (nm) |
| --- | --- | --- | --- | --- | --- | --- | --- |
| Ex. 1 | Air (25° C./60%) | 1.00 | 50 | 3.9/3.9 | 0 | 0.122 | 0.165 |
| Ex. 2 | Air (25° C./60%) | 1.00 | 100 | — | — | 0.080 | 0.210 |
| Ex. 3 | Air (25° C./60%) | 1.00 | 200 | — | — | 0.080 | 0.200 |
| Ex. 4 | Air (25° C./60%) | 1.05 | 20 | 3.8/3.5 | 8 | 0.121 | 0.179 |
| Ex. 5 | Air (25° C./60%) | 1.05 | 50 | — | — | 0.139 | 0.175 |
| Ex. 6 | Air (25° C./60%) | 1.10 | 10 | 4.9/4.9 | 0 | 0.113 | 0.155 |

TABLE 1-continued

|  | Atmosphere | Fluence (J/cm²) | Number of Shots | Concave Defect Depth Before Irradiation/ After Irradiation | Repair Rate (%) | RMS of Before Irradiation (nm) | RMS of After Irradiation (nm) |
|---|---|---|---|---|---|---|---|
| Ex. 7 | Air (25° C./60%) | 1.10 | 50 | — | — | 0.080 | 0.230 |
| Ex. 8 | Air (25° C./60%) | 1.10 | 200 | — | — | 0.080 | 0.300 |
| Ex. 9 | N₂ (Purity 99.99%) | 1.10 | 200 | — | — | 0.080 | 0.210 |
| Ex. 10 | Vacuum (10⁻¹ Pa) | 1.10 | 200 | — | — | 0.080 | 0.180 |
| Ex. 11 | N₂ (Purity 99.99%) Spraying through Nozzle | 1.00 | 100 | 5.7/3.2 | 44 | 0.129 | 0.131 |
| Ex. 12 | N₂ (Purity 99.99%) Spraying through Nozzle | 1.05 | 50 | 24.6/19.0 | 23 | 0.121 | 0.121 |
| Ex. 13 | N₂ (Purity 99.99%) Spraying through Nozzle | 1.10 | 50 | 11.1/6.6 | 41 | 0.109 | 0.110 |

It can be seen from the results of Examples 7 and 8 that the RMS is greater than 0.20 nm at 50 shots or more, which is not preferable, when the substrate of which the RMS is 0.08 mm before the laser irradiation was carried out at the fluence of 1.10 J/cm².

The influence of the irradiation atmosphere was observed by changing the irradiation atmosphere under the same irradiation condition as Example 8. A substrate was placed in a chamber, the inside of the chamber was purged with nitrogen with a purity of 99.99%, and then the substrate with a size of 5 cm square was irradiated with the KrF excimer laser by 200 shots at 1.10 J/cm² (Example 9), in the same manner as in Example 8. The RMS measurement result of the irradiating surface in Example 9 is shown in Table 1. The air in the chamber was discharged with a rotary pump into a vacuum state of 10⁻¹ Pa, and then the substrate with a size of 5 cm square was similarly irradiated with the KrF excimer laser by 200 shots at 1.10 J/cm² (Example 10). The RMS measurement result of the irradiating surface in Example 11 is shown in Table 1.

Comparing Example 9 with Example 8 in Table 1, the RMS value of the case where the inside of the chamber was purged with nitrogen (Example 9) was lower than that of the case where the excimer laser irradiation was carried out in the air with the relative humidity of 60% at a temperature of 25° C. (Example 8).

Comparing Example 10 with Example 8 in Table 1, the RMS value of the case where the inside of the chamber was discharged into the vacuum state (Example 10) was lower than that of the case where the excimer laser irradiation was carried out in the air with the relative humidity of 60% at a temperature of 25° C. (Example 8).

It can be seen from Examples 7 to 10 that the decrease in RMS value after the laser irradiation can be suppressed even under the same irradiation condition by lowering the humidity of the irradiation atmosphere.

Irradiation Example II

Plural concave defects existing in the optical surface of a silica glass substrate containing TiO₂ as a dopant (having a TiO₂ concentration of 7.0 mass %) (Product No. AZ6025 manufactured by Asahi Glass Company, Ltd. of 150 mm square) were detected and the size (depth) thereof and the RMS value around the concave defects were measured. Scanning irradiation was carried out with respect to plural areas of 20 mm square including the concave defects, with the KrF excimer laser in the form of a line beam, in the same manner as in the above-mentioned examples.

In Example 1 and Examples 4 to 6, the laser irradiation was carried out in the air with the relative humidity of 60% (water vapor partial pressure of 14.3 mmHg) at a room temperature of 25° C. In Examples 11 to 13, the laser irradiation was carried out while spraying the laser irradiating site on the substrate surface with a nitrogen gas having a purity of 99.99% using a nozzle.

The irradiation condition, the change in concave defect depth and the change in RMS before and after the laser irradiation are shown in Table 1. In Table 1, the concave defect depth repair rate was calculated by the following formula.

$$\text{concave defect depth repair rate (\%)} = ((\text{concave defect depth } (PV \text{ value}) \text{ before laser irradiation} - \text{concave defect depth } (PV \text{ value}) \text{ after laser irradiation})/\text{concave defect depth } (PV \text{ value}) \text{ before laser irradiation}) \times 100 \quad \text{[Mathematical Formula 2]}$$

The irradiation condition of 1.00 J/cm² and 50 shots or more, the irradiation condition of 1.05 J/cm² and 20 shots or more, and the irradiation condition of 1.10 J/cm² and 10 shots or more do not satisfy the substrate specification of RMS≦50.15 nm, when the laser irradiation was carried out in the usual air (having the relative humidity of 60% (water vapor partial pressure of 14.3 mmHg) at 25° C.) as shown in Table 1 (Examples 1 to 8).

However, as shown in Examples 11 to 13, it is possible to reduce the concave defect depths while satisfying the substrate specification of RMS by carrying out the laser irradiation in the nitrogen atmosphere. Particularly, in the case of 1.10 J/cm² and 50 shots (Example 13), the concave defect depth before the laser irradiation was 11.1 nm which was very great, but the RMS value after the laser irradiation was RMS=0.11 nm and the concave defect depth repair rate was 41%, which is a very excellent value.

On the other hand, in Examples 1, 4, and 6 in which the laser irradiation was carried out in the air, the concave defect depth repair rate was low and the RMS after the laser irradiation was greater than 0.15 nm, whereby it can be seen that it is difficult to allow the concave defect depth repair rate and the RMS to be consistent with each other.

Irradiation Example III

Scanning irradiation was carried out over the entire surface of a substrate obtained by cutting a silica glass substrate containing TiO₂ as a dopant (having a TiO₂ concentration of 7.0 mass %) (Product No. AZ6025 manufactured by Asahi Glass Company, Ltd. of 150 mm square) into a size of 5 cm square with a KrF excimer laser in the form of a line beam while changing the irradiation fluence and the number of shots, in the same manner as in the above-mentioned examples.

The laser irradiation was carried out in the air having the relative humidity of 60% (water vapor partial pressure of 14.3 mmHg) at a room temperature of 25° C. while changing the irradiation condition. The laser irradiation was carried out while spraying the laser irradiating site on the substrate surface at 25° C. with a nitrogen gas having a purity of 99.99% using a nozzle and changing the irradiation condition. The irradiation conditions and the changes (nm) in RMS before and after the laser irradiation are shown in Table 2.

When the nitrogen gas was applied at the time of the laser irradiation at the same fluence, it can be said that the change in RMS is smaller and the process window is wider than that of the case where the laser irradiation was carried out in the air with the relative humidity of 60% at 25° C. When the process window is widened, it is possible to gain a concave defect depth repair rate.

TABLE 2

| Fluence (J/cm$^2$) | Number of Shots | Change in RMS (nm) | |
|---|---|---|---|
| | | Air | N$_2$ |
| 1.00 | 50 | 0.060 | 0.043 |
| | 100 | 0.102 | 0.078 |
| | 200 | | 0.104 |
| 1.05 | 20 | 0.075 | 0.034 |
| | 50 | 0.088 | 0.071 |
| | 100 | | 0.101 |

Irradiation Example IV

A silica glass substrate containing TiO$_2$ as a dopant (having a TiO$_2$ concentration of 7.0 mass %) (Product No. AZ6025 manufactured by Asahi Glass Company, Ltd. of 150 mm square) was placed in a chamber and the inside of the chamber was purged with nitrogen of a purity of 99.99% at 25° C. Scanning irradiation was carried out with respect to a half of the substrate surface, with the KrF excimer laser in the form of a line beam at the fluence of 0.9 J/cm$^2$ by the number of shots of 25, in the same manner as in the above-mentioned examples.

A multi-layered reflecting film in which molybdenum (Mo) and silicon (Si) were alternately stacked and then the number of concave defects and the RMS were measured. The number of concave defects was measured using an inspection tool of M1350 (manufactured by Lasertec Corporation). The number of concave defects in the surface irradiated with the laser was reduced to ½ of that in the surface not irradiated with the laser and the number of scratch defects was reduced to ⅕ thereof. The RMS of the surface irradiated with the laser was 0.12 nm.

Irradiation Example V

Scanning irradiation was carried out over the entire surface of a silica glass substrate containing TiO$_2$ as a dopant (having a TiO$_2$ concentration of 7.0 mass %) (Product No. AZ6025 manufactured by Asahi Glass Company, Ltd. of 150 mm square), with the KrF excimer laser in the form of a line beam at the fluence of 0.9 J/cm$^2$ by the number of shots of 20, in the same manner as in the above-mentioned examples. The flatness was measured before and after the laser irradiation and the change was 130 nm. The back surface of the substrate was irradiated with the laser under the same condition as the surface and the change in flatness was returned to 44 nm.

Irradiation Example VI

The fictive temperature of the surface irradiated with the laser was measured by performing an FT-IR spectrum measurement on the surface. The fictive temperature of the substrate surface not irradiated with the laser was 1150° C. which is the annealing temperature at the time of manufacturing the substrate. The fictive temperatures of the substrate surfaces irradiated with the laser are shown in Table 3. It can be seen that the fictive temperature of the substrate surface rises along with the irradiation fluence by the laser irradiation.

TABLE 3

| Fluence (J/cm$^2$) | Number of Shots | Fictive Temperature (° C.) |
|---|---|---|
| unirradiated | unirradiated | 1150 |
| 0.7 | 50 | 1181 |
| 0.9 | 50 | 1477 |
| 1.1 | 50 | 1736 |
| 1.3 | 50 | 1767 |

Irradiation Example VII

The area on the substrate surface in which the concave defects were generated was irradiated with a carbon dioxide gas laser with the average power of 7 W and a RF driven pulse (having a pulse width of 0.5 ms) of 1 KHz. The carbon dioxide gas laser is a beam (having a diameter of 1.5 mm) concentrated using a ZnSe planoconvex lens as an irradiation optical system, with which the substrate was irradiated for 1 second. At this time, the irradiation fluence was 0.4 J/cm$^2$ and the number of shots was 1000.

It was confirmed that the concave defects disappeared after the laser irradiation. That is, the concave defect repairing rate was 100%.

This application is based on Japanese patent application No. 2008-234906 filed on Sep. 12, 2008, the entire contents of which are incorporated hereinto by reference.

Industrial Applicability

According to the smoothing method of the present invention, it is possible to smooth the optical surface having the concave defects while minimizing the decrease in flatness and the deterioration in surface roughness, by irradiating the optical surface of the optical component for EUVL having the concave defects with a laser having an oscillation wavelength, to which the optical component for EUVL has an absorption coefficient of 0.01 μm$^{-1}$ or more, at a fluence of 0.3 to 1.5 J/cm$^2$ in an atmosphere having a water vapor partial pressure of 3.6 mmHg or less. It is also possible to expect an improvement in defect repair rate. It is also possible to expect a wider process window.

| Reference Signs List | |
|---|---|
| 10: | Optical component for EUVL |
| 11: | Optical surface |
| 20: | Cylindrical lens |
| 21: | Line beam (excimer laser) |
| 30: | Chamber with laser irradiation window |
| 31: | Laser irradiation window (synthesized quartz) |

The invention claimed is:
1. A method for smoothing an optical surface of an optical component for EUVL, comprising
   irradiating an optical surface having a concave defect of an optical component for EUV lithography (EUVL) made of a silica glass material containing TiO$_2$ and comprising

SiO₂ as a main component with a laser having an oscillation wavelength, to which the optical component for EUVL has an absorption coefficient of 0.01 μm⁻¹ or more, at a fluence of 0.3 to 1.5 J/cm² in an atmosphere having a water vapor partial pressure of 3.6 mmHg or less.

2. The method according to claim 1, comprising
irradiating an optical surface having a concave defect with a depth of greater than 2 nm of the optical component for EUVL with a laser having an oscillation wavelength, to which the optical component for EUVL has the absorption coefficient of 0.01 gm⁻¹ or more, at the fluence of 0.3 to 1.5 J/cm² in the atmosphere having a water vapor partial pressure of 3.6 mmHg or less, and thereby obtaining an optical component free from a concave defect having a depth of greater than 2 nm in the optical surface irradiated with the laser.

3. The method according to claim 1, wherein the atmosphere having a water vapor partial pressure of 3.6 mmHg or less is a vacuum of 10⁻¹ Pa or less, a nitrogen gas atmosphere having a purity of 90% or more, or a dry air atmosphere having a water vapor partial pressure of 3.6 mmHg or less.

4. A method for smoothing an optical surface of an optical component for EUVL, comprising
irradiating an optical surface having a concave defect of an optical component for EUV lithography (EUVL) made of a silica glass material containing TiO₂ and comprising SiO₂ as a main component with a laser having an oscillation wavelength, to which the optical component for EUVL has an absorption coefficient of 0.01 μm⁻¹ or more, at a fluence of 0.3 to 1.5 J/cm² while spraying a laser irradiating site of the optical surface with a gas having a water vapor partial pressure of 3.6 mmHg or less.

5. The method according to claim 4, comprising
irradiating an optical surface having a concave defect with a depth of greater than 2 nm of the optical component for EUVL with a laser having an oscillation wavelength, to which the optical component for EUVL has the absorption coefficient of 0.01 μm⁻¹ or more, at the fluence of 0.3 to 1.5 J/cm² while spraying the laser irradiating site of the optical surface with a gas having a water vapor partial pressure of 3.6 mmHg or less, and thereby obtaining an optical component free from a concave defect having a depth of greater than 2 nm in the optical surface irradiated with the laser.

6. The method according to claim 4, wherein the gas having a water vapor partial pressure of 3.6 mmHg or less is a nitrogen gas atmosphere having a purity of 90% or more, or a dry air atmosphere having a water vapor partial pressure of 3.6 mmHg or less.

7. The method according to claim 1, which provides a change in flatness of the optical component between before and after the laser irradiation of 300 nm or less.

8. The method according to claim 1, which provides a surface roughness (RMS) of the optical surface after the laser irradiation of 0.15 nm or less.

9. The method according to claim 1, wherein the laser is an excimer laser with a wavelength of 250 nm or less, or a carbon dioxide gas laser.

10. The method according to claim 1, wherein the laser has a pulse width of 100 μsec or less.

11. The method according to claim 1, wherein the laser irradiation is carried out such that the number of shots at each irradiated site becomes 10 or more.

12. The method according to claim 1, wherein the laser is irradiated in the form of a line beam with respect to the optical surface, and the irradiation is carried out by scanningly moving the line beam with respect to the optical surface or scanningly moving the optical surface with respect to the line beam.

13. The method according to claim 1, further comprising
irradiating a back surface with respect to the optical surface with a laser having an oscillation wavelength, to which the optical component for EUVL has an absorption coefficient of 0.01 μm⁻¹ or more, at a fluence of 0.3 to 1.5 J/cm².

14. An optical component for EUVL produced using the method according to claim 1, wherein a surface layer containing the optical surface has a fictive temperature that is higher, by 30° C. or more, than the fictive temperature of the other sites.

15. A mask blank for EUVL produced by smoothing an optical surface of an optical component for EUVL using the method according to claim 1, and then forming a multi-layered reflecting film and an absorber layer on the optical surface.

16. The mask blank according to claim 15, wherein the formed layer surface is free from a concave defect having a depth of greater than 2 nm.

17. The mask blank according to claim 15, wherein the formed layer surface has a surface roughness (RMS) of 0.15 nm or less.

18. The mask blank according to claim 15, having a flatness after the layer formation of 300 nm or less.

19. A mirror for EUVL produced by smoothing an optical surface of an optical component for EUVL using the method according to claim 1, and then forming a multi-layered reflecting film on the optical surface.

20. The mirror according to claim 19, wherein the formed film surface is free from a concave defect having a depth of greater than 2 nm.

21. The mirror according to claim 19, wherein the formed film surface has a surface roughness (RMS) of 0.15 nm or less.

22. The mirror according to claim 19, having a flatness after the film formation of 300 nm or less.

* * * * *